(12) United States Patent
Akagawa et al.

(10) Patent No.: US 9,166,193 B2
(45) Date of Patent: Oct. 20, 2015

(54) LIGHT EMITTING DEVICE, METHOD OF MANUFACTURING THE SAME, AND ELECTRONIC APPARATUS

(71) Applicant: SEIKO EPSON CORPORATION, Tokyo (JP)

(72) Inventors: Suguru Akagawa, Suwa (JP); Takefumi Fukagawa, Fujimi-machi (JP); Hisatoshi Nakamura, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 13/958,892

(22) Filed: Aug. 5, 2013

(65) Prior Publication Data
US 2014/0042408 A1 Feb. 13, 2014

(30) Foreign Application Priority Data
Aug. 7, 2012 (JP) ................. 2012-174686

(51) Int. Cl.
| H01J 1/62 | (2006.01) |
| H01L 33/36 | (2010.01) |
| H05B 33/06 | (2006.01) |
| H01L 51/52 | (2006.01) |
| H01L 51/56 | (2006.01) |
| H01L 27/32 | (2006.01) |

(52) U.S. Cl.
CPC ........ H01L 51/5253 (2013.01); H01L 27/3276 (2013.01); H01L 51/56 (2013.01); *H01L 51/5246* (2013.01); *H01L 51/5265* (2013.01); *H01L 2251/566* (2013.01)

(58) Field of Classification Search
CPC ......... H01L 51/52; B32B 37/24; H05B 33/04
USPC ............ 257/40, E33.062; 313/483, 504, 512; 445/24, 25
See application file for complete search history.

(56) References Cited

U.S. PATENT DOCUMENTS

| 2007/0132381 A1 | 6/2007 | Hayashi et al. |
| 2010/0019654 A1* | 1/2010 | Hayashi ........................ 313/498 |
| 2011/0148831 A1 | 6/2011 | Tamaki et al. |

FOREIGN PATENT DOCUMENTS

| JP | A-2007-157606 | 6/2007 |
| JP | A-2008-071671 | 3/2008 |
| JP | A-2010-182530 | 8/2010 |
| JP | A-2011-083990 | 4/2011 |
| JP | A-2011-150999 | 8/2011 |
| JP | B2-4924329 | 4/2012 |

* cited by examiner

*Primary Examiner* — Kimberly Rizkallah
*Assistant Examiner* — Brian Turner
(74) *Attorney, Agent, or Firm* — Oliff PLC

(57) ABSTRACT

Disclosed is an organic EL device as an light emitting device according to this application example includes a base material as a substrate, and an organic EL element as a plurality of light emitting elements having a light emitting functional layer as a functional layer in which an organic light emitting layer is included between a pixel electrode as an anode and an opposed electrode as a cathode and a sealing layer sealing the plurality of organic EL elements which are formed on the base material, and the opposed electrode is formed over the plurality of organic EL elements as a common cathode, and the sealing layer is formed so as to cover the common cathode in the same region where the common cathode is formed or inwards from the region.

20 Claims, 13 Drawing Sheets

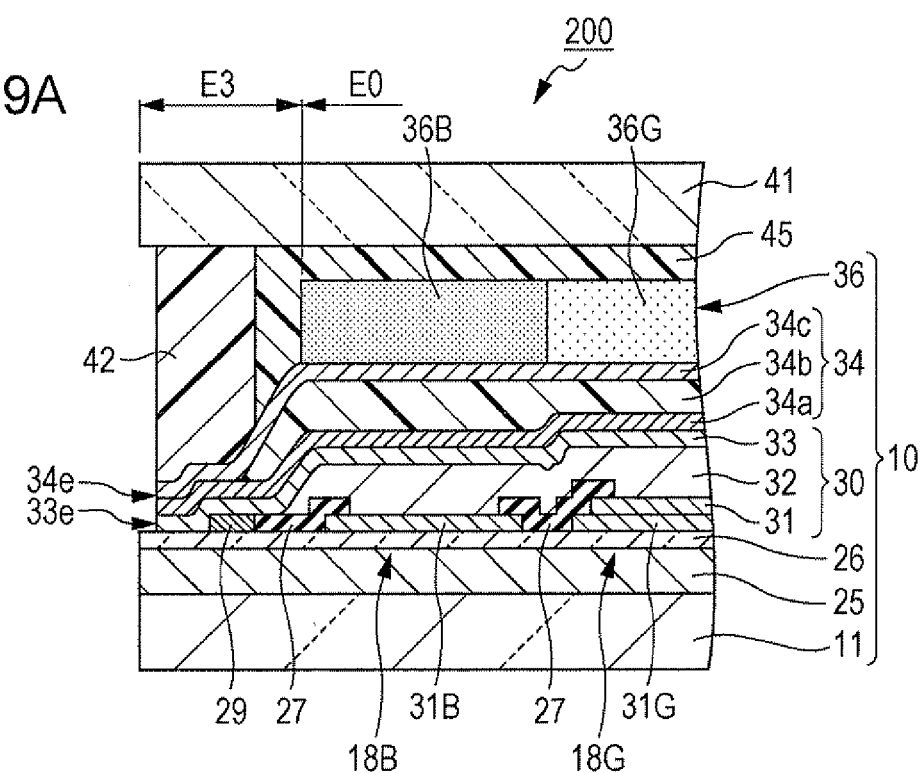
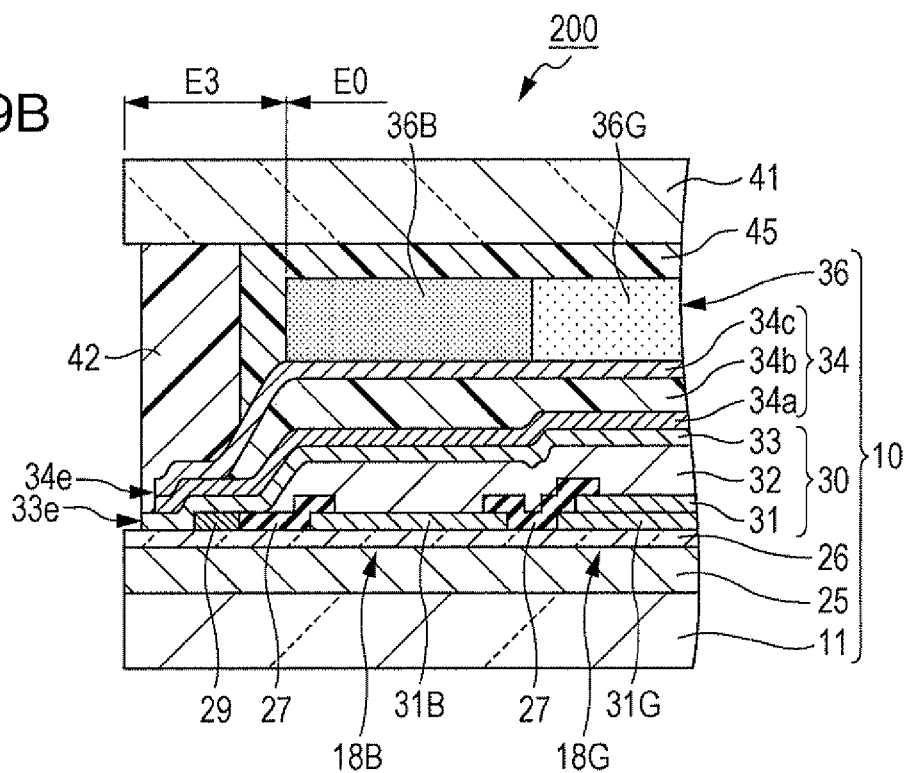

LIGHT EMITTING DEVICE, METHOD OF MANUFACTURING THE SAME, AND ELECTRONIC APPARATUS

BACKGROUND

1. Technical Field

The present invention relates to a light emitting device including light an emitting element, a method of manufacturing a light emitting device, and an electronic apparatus.

2. Related Art

An organic electroluminescence (EL) element which is easy to be made thinner and more compact compared to a light emitting diode as a light emitting element attracts attentions. An organic EL element has a functional layer including an organic light emitting layer between an anode and a cathode, if a voltage is applied between the anode and the cathode, light emission is obtained from the organic light emitting layer depending on an amount of current flowing through the functional layer.

In such a functional layer, a light emitting function thereof is decreased or lost if water, or oxygen, or the like penetrates from outside. Therefore, it is necessary to provide ways for preventing the water, or the oxygen, or the like from penetrating in order to ensure a light-emission lifetime of the organic EL element.

For example, in JP-A-2007-157606, there is proposed a sealing structure of the organic EL element covering a second electrode as a common cathode, in which a first inorganic layer, a second inorganic layer, an organic buffer layer, and a gas barrier layer are sequentially laminated.

According to this, since the organic buffer layer is provided between the organic EL element and the gas barrier, for example, when cracks occur by expansion and contraction due to heat, it is possible to provide a long-lifetime light emitting device by preventing water, or oxygen, or the like from penetrating from respective cracks. According to the above-described JP-A-2007-157606, the gas barrier layer is formed not only to cover the organic buffer layer but also to cover a peripheral edge portion of the first inorganic layer covering the second electrode. Accordingly, on a substrate, a peripheral region that covers a region in which a plurality of organic EL elements are disposed is necessary in order to reliably cover the peripheral edge portion of the first inorganic layer by the gas barrier.

However, if decreasing an area of the peripheral region in an attempt to reduce the size of the light emitting device itself, there has been a problem in that it is difficult to adopt the sealing structure of the above-described JP-A-2007-157606.

SUMMARY

The invention can be realized in the following forms or application examples.

Application Example 1

According to this application example, there is provided a light emitting device including a substrate; a plurality of light emitting elements formed on the substrate in which an organic light emitting layer is included between an anode and a cathode; and a sealing layer that seals the plurality of light emitting elements, in which the cathode is formed over the plurality of light emitting elements as a common cathode, in which the sealing layer is formed so as to cover the common cathode in the same region where the common cathode is formed or inwards from the region.

In this case, since the sealing layer does not cover a peripheral end portion of the common cathode, a peripheral region of a region where the plurality lighting elements are provided may not be larger than needed. Therefore, since the peripheral region (frame region) is smaller than the light emitting device to which a sealing structure of the related art is adopted, the light emitting device that is more compact may be realized.

Application Example 2

In the light emitting device according to the application example, it is preferable that a portion, which is not covered by the sealing layer, of the common cathode be passivated.

In this case, for example, even if the portion, which is not covered by the sealing layer, of the common cathode is touched by water or oxygen, since the portion is passivated, the water, or the oxygen, or the like hardly penetrate inwards from the portion. That is, a more compact light emitting device in which reliability is ensured in emission lifetime may be provided.

Application Example 3

It is preferable that the light emitting device according to the application example, further include a wiring layer formed between the substrate and the common cathode, and a contact portion that is formed between the wiring layer and the common cathode, is in contact with the common cathode of the portion covered by the sealing layer, and electrically connects with the wiring layer and the common cathode.

In this case, since the contact portion of the common cathode is formed between the region and the wiring layer in which the plurality of light emitting elements are provided, penetration of the water and the oxygen may be blocked by the contact portion. Therefore, a more compact light emitting device having the high reliability in the emission lifetime may be provided.

Application Example 4

In the light emitting device according to the application example, it is preferable that the sealing layer include a first inorganic sealing layer formed in contact with the common cathode, a buffer layer sequentially laminated on the first inorganic sealing layer, and the second inorganic sealing layer.

In this case, since the sealing layer is configured to have the first inorganic sealing layer and the second inorganic sealing layer stacked across the buffer layer so that the water or the oxygen does not easily penetrate, the more compact light emitting device having the high reliability in the emission lifetime may be provided.

Application Example 5

In the light emitting device according to the application example, it is preferable that the buffer layer be configured of an organic material.

In this case, by configuring the buffer layer using an organic material, for example, the buffer layer may be formed by a coating method, thereby enabling to give a planarization function to the buffer layer.

Application Example 6

It is preferable that the light emitting device according to the application example, further include a color filter formed to correspond to the plurality of light emitting elements on the sealing layer.

In this case, a full color display may be achieved, and a more compact light emitting device having the high reliability in the emission lifetime may be provided.

Application Example 7

It is preferable that the light emitting device according to the application example, further include an opposed substrate disposed opposite with respect to the sealing layer of the substrate layer via a transparent resin layer.

In this case, a more compact light emitting device having the high reliability in the emission lifetime may be provided.

Application Example 8

In the light emitting device according to the application example, it is preferable that the transparent resin layer have a dam material preventing the transparent resin layer from protruding outwards from the opposed substrate, and the dam material is provided in a position overlapping an outer edge of the sealing layer.

In this case, the more compact light emitting device having reliability with high light emission lifetime may be provided without the protrusion of the transparent resin layer from the opposed substrate.

Application Example 9

According to this application example, there is provided a method of manufacturing a light emitting device provided with a plurality of light emitting elements including a functional layer in which an organic light emitting layer is included between an anode and a cathode on a substrate, the method including: forming the cathode over the plurality of light emitting elements as a common cathode, and forming a sealing layer that seals the common cathode and seals the plurality of light emitting elements in the same region where the common cathode is formed or inwards from the region.

In this case, the peripheral end portion of the common cathode may not be covered by the sealing layer, the peripheral end portion in which the plurality of light emitting elements are provided may not necessarily be larger than needed. Therefore, since the peripheral region (frame region) is smaller than the light emitting device to which a sealing structure of the related art is adopted, the light emitting device that is more compact may be realized.

Application Example 10

It is preferable that the method of manufacturing a light emitting device according to the application example, further include the common cathode using the sealing layer as a mask.

In this case, since the sealing layer is used as a mask, protrusion of the common cathode outwards from the sealing layer may be suppressed. Therefore, the peripheral end portion of the sealing layer and the peripheral end portion of the common cathode may be gathered. That is, the more compact light emitting device may be manufactured.

Application Example 11

In the method of manufacturing a light emitting device according to the application example, the common cathode is preferably dry-etched using treatment gas containing the oxygen in the common cathode patterning.

In this case, during the dry-etching of the common cathode, the portion, which is not covered by the sealing layer, of the common cathode may be passivated. As a result, since the passivated portion of the common cathode functions to block penetration of water or oxygen, the more compact light emitting device having high reliability in the light emission lifetime may be provided.

Application Example 12

In the method of manufacturing a light emitting device according to the application example, it is preferable that forming the sealing layer includes forming a first inorganic sealing layer in contact with the common cathode, forming a buffer layer in contact with the first inorganic sealing layer, and forming a second inorganic sealing layer covering the buffer layer.

In this case, since the sealing layer is formed inwards from the first and the second inorganic sealing layers across the buffer layer in which the water or the oxygen does not easily penetrate, the more compact light emitting device having high reliability may be provided.

Application Example 13

It is preferable that the method of manufacturing a light emitting device according to the application example, further include performing a plasma treatment using the treatment gas containing oxygen on the substrate in which the first inorganic sealing layer is formed before the buffer layer is formed.

In this case, by the plasma treatment, containments or the like adhering to the surface of the first inorganic sealing layer may be removed, and adhesion between the buffer layer and the first inorganic sealing layer may be improved. In addition, the portion, which is not covered by the first inorganic sealing layer, of the common cathode may be passivated. The penetration of the water or the oxygen may be blocked by the passivated portion of the common cathode.

That is, the more compact light emitting device having the high reliability in the light emission lifetime may be manufactured.

Application Example 14

In the method of manufacturing a light emitting device according to the application example, it is preferable that forming the sealing layer using a mother substrate on which the substrate is imposed in a plural number has dicing of cutting the mother substrate while cutting a margin of the interval by forming the sealing layer at intervals with respect to scribe lines for extracting the substrate from the mother substrate.

In this case, since damages to the sealing layer during the dicing may be prevented, a more compact light emitting device having high reliability in the light emission lifetime may be manufactured.

Application Example 15

According to this application example, there is provided an electronic apparatus including the light emitting device according to the application examples.

In this case, high reliability in the emission lifetime may be achieved, and an electronic apparatus that is more compact may be provided.

BRIEF DESCRIPTION OF THE DRAWINGS

The invention will be described with reference to the accompanying drawings, wherein like numbers reference like elements.

FIGS. 9A and 9B are schematic cross-sectional views illustrating the configuration of a non-display region of the organic EL device of the second embodiment.

DESCRIPTION OF EXEMPLARY EMBODIMENTS

Hereinafter, embodiments that embody the present invention will be described according to the drawings. Additionally, the drawings that are used are displayed enlarged or reduced as appropriate so that the portions that are being described are recognizable.

Additionally, in the embodiments below, for example, in a case in which the description "on the substrate" is used, a situation of being disposed in contact with the top of the substrate, a situation of being arranged on top of the substrate through another component, or a situation of a portion thereof being disposed so as to be in contact with the top of the substrate and a portion thereof being disposed through another component is being described.

First Embodiment

Light Emitting Apparatus

Figure 1:
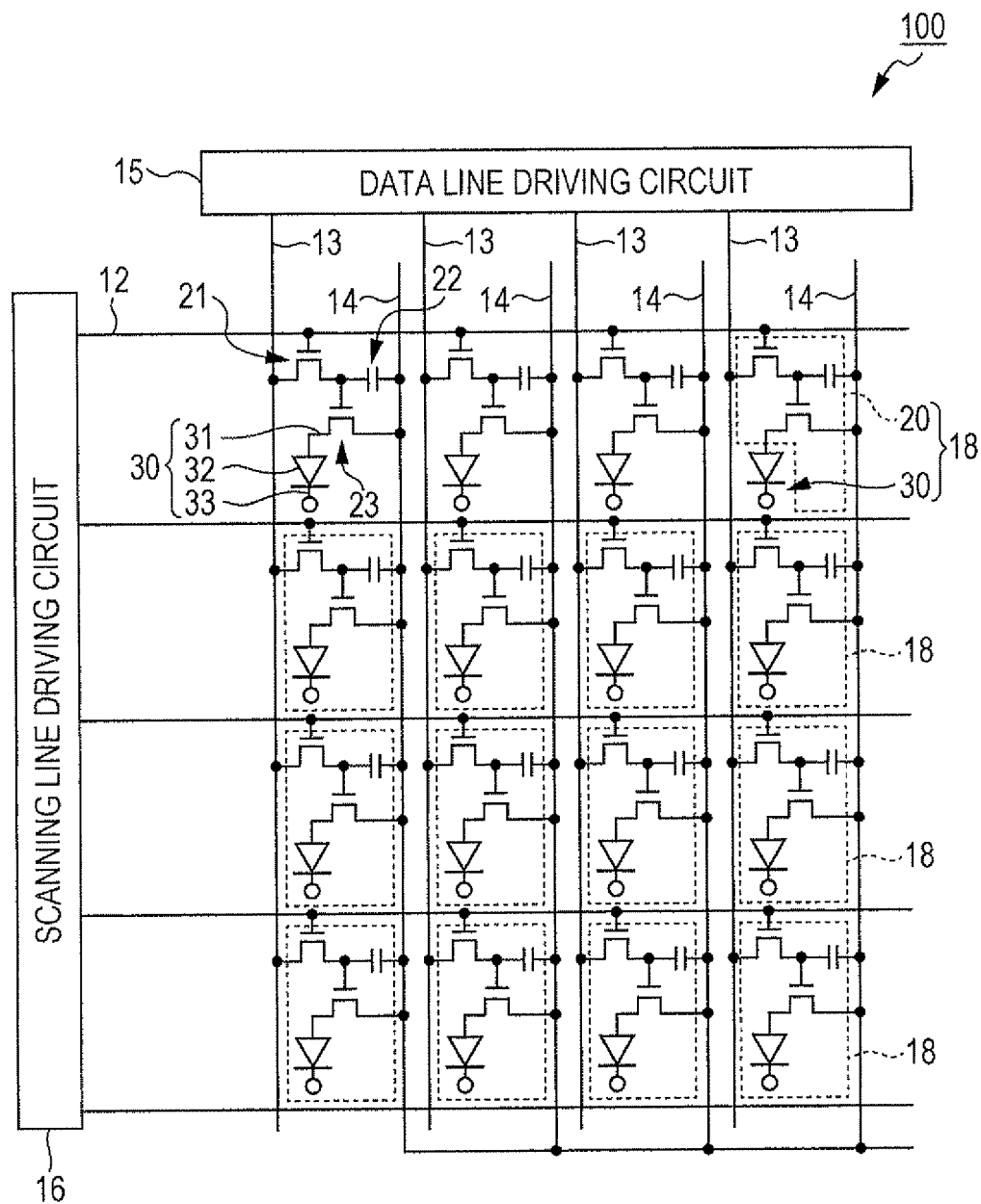
FIG. 1 is an equivalent circuit view illustrating an electrical configuration of an organic EL device of a first embodiment.
Figure 2:
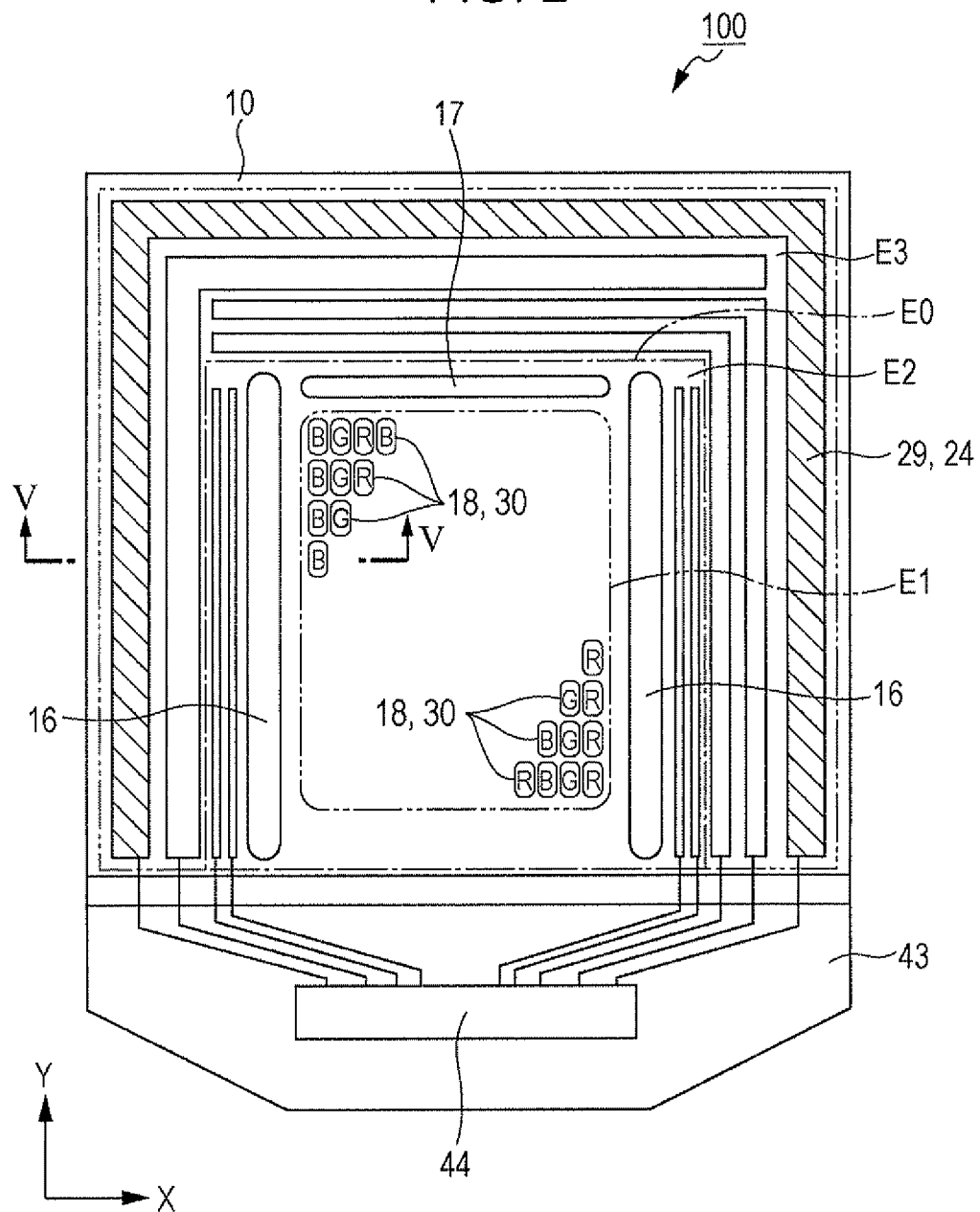
FIG. 2 is a schematic plan view illustrating the organic EL device of the first embodiment.
Figure 3:
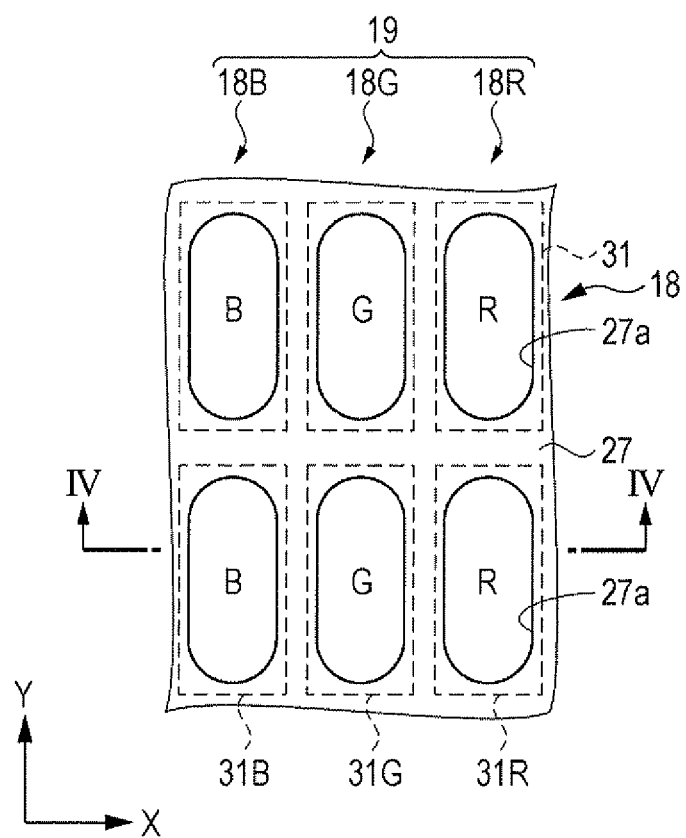
FIG. 3 is a schematic plan view illustrating a displacement of a light emitting pixel according to the first embodiment.

First, an organic electroluminescence (EL) device as a light emitting device of the present embodiment will be described with reference to FIGS. 1 to 3. FIG. 1 is an equivalent circuit view illustrating an electrical configuration of an organic EL device of a first embodiment, FIG. 2 is a schematic plan view illustrating the organic EL device of the first embodiment, and FIG. 3 is a schematic plan view illustrating displacement of a light emitting pixel according to the first embodiment.

As illustrated in FIG. 1, an organic EL device 100 as a light emitting device of the embodiment has a plurality of scanning lines 12 and a plurality of data lines 13 which mutually intersect each other and a plurality of power supply lines 14 that are parallel respectively with respect to the plurality of data lines 13 respectively. The organic EL device has a scanning line driving circuit 16 to which the plurality of scanning lines 12 are connected and a data line driving circuit 15 to which the plurality of data lines 13 are connected. Moreover, the organic EL device has a plurality of sub-pixels 18 disposed in a matrix manner with respect to respective intersections of the plurality scanning lines 12 and the plurality of data lines 13 as light emitting pixels.

The sub-pixel 18 has an organic EL element 30 as a light emitting element and a pixel circuit 20 controlling driving of the organic EL element 30.

The organic EL element 30 has a pixel electrode 31 functioning as an anode, opposed electrode 33 functioning as a cathode, and light emitting functional layer 32 provided between the pixel electrode 31 and the opposed electrode 33. Such organic EL elements 30 can be expressed as diodes electrically.

The pixel circuit 20 includes a switching transistor 21, a storage capacitor 22, and a driving transistor 23. The two transistors 21 and 23, for example, can be configured using an n-channel type or a p-channel type thin film transistor (TFT; Thin Film Transistor) or a MOS transistor.

The gate of the switching transistor 21 is connected to the scanning line 12, one side of a source or a drain is connected to the data line 13, and the other of the source or the drain is connected to the gate of the driving transistor 23.

One side of a source or a drain of the driving transistor 23 is connected to a pixel electrode 31 of the organic EL element 30, and the other of the source or the drain is connected to a power supply line 14.

The storage capacitor 22 is connected between the gates of the driving transistor 23 and the power supply line 14.

If the switching transistor 21 is in ON state as the scanning line 12 is driven, at that time, a potential based on the image signals supplied from the data line 13 is held in the storage capacitor 22 via the switching transistor 21. Depending to the potential of the storage capacitor 22, in other words, the potential of the gates of driving transistor 23, the ON-OFF state of the driving transistor 23 is determined. Then, when the driving transistor 23 is in ON state, an amount of current depending on the gate potential flows from the power supply line 14 to the light emitting functional layer 32 pinched between the pixel electrode 31 and the opposed electrode 33 via the driving transistor 23. The organic EL element 30 emits light corresponding to the amount of current flowing through the light emitting functional layer 32.

As illustrated in FIG. 2, the organic EL device 100 has an element substrate 10. On the element substrate 10, a display region E0 (in the drawing, marked with a dashed line) and a non-display region E3 are provided outside the display region E0. The display region E0 has an actual display region E1 (in the drawing, marked with a two-dot chain line) and a dummy region E2 surrounding the actual display region E1.

In the actual display region E1, sub-pixel 18 as a light emitting pixels is disposed in a matrix manner. The sub-pixel 18, as described above, includes the organic EL element 30 as the light emitting element, and is configured to obtain any color of blue (B), green (G), and red (R) according to operation of the switching transistor 21 and the driving transistor 23.

In the embodiment, the sub-pixels 18 in which light emission of the same colors can be obtained are arranged in a first direction, and the sub-pixels 18 in which light emission of different colors are arranged in a second direction crossing (orthogonal) with respect to the first direction. The disposition of the sub-pixel 18, so-called, is a stripe type. Hereinafter, the first direction and the second direction will be described as a Y direction and an X direction respectively. In addition, the disposition of the sub-pixel 18 in the element substrate 10 is not limited to the stripe type, and may be a mosaic type or a delta type.

A peripheral circuit for mainly light-emitting the organic EL element 30 of each sub-pixel 18 is provided in the dummy region E2. For example, as illustrated in FIG. 2, a pair of scanning line driving circuits 16 is provided to extend in the Y direction at a position across the actual display region E1 in the X direction. A test circuit 17 is provided at a position along the actual display region E1 between the pair of scanning line driving circuits 16.

In the element substrate 10, a wiring layer 24 disposed so as to surround the display region E0 is provided to extend in the Y direction along the pair of scanning line driving circuits 16 and in the X direction along the test circuit 17. Moreover, a contact portion 29 which is disposed to be superimposed on the wiring layer 24 and is electrically connected to the wiring layer 24 is provided. The details will be described later, but the opposed electrode 33 of the organic EL element 30 is formed over the plurality of organic EL elements 30, that is, the plurality of the sub-pixels 18 as common cathodes, is formed over the display region E0 and the non-display region E3. The opposed electrode 33 is formed in contact with the contact portion 29 in the non-display region E3.

A flexible circuit substrate (FPC) 43 for achieving electrical connection with an external driving circuit is connected to one side portion (side portion of lower part of the drawing) in the Y direction of the element substrate 10. In the FPC 43, a driving IC 44 is installed to be connected to a peripheral circuit of the element substrate 10 via the wires of the FPC 43. The driving IC 44 includes the above-described data line driving circuit 15, and the data line 13 and the power supply line 14 of the element substrate 10 are electrically connected to the driving IC 44 via the FPC 43. The opposed electrode 33 as a common cathode is also electrically connected to the driving IC 44 via the contact portion 29, the wiring layer 24, and the FPC 43.

Next, planar disposition of the sub-pixel 18, especially, planar disposition of the pixel electrode 31 will be described with reference to FIG. 3. As illustrated in FIG. 3, a sub-pixel 18B in which light emission of blue (B) can be obtained, a sub-pixel 18G in which the light emission of green (G) can be obtained, and a sub-pixel 18R in which the light emission of red (R) can be obtained, are sequentially arranged in the X direction. The sub-pixels 18 in which the light emission of the same color can be obtained are arranged in the Y direction. Display is performed in the configuration in which the three sub-pixels 18B, 18G, and 18R disposed in the X direction are considered as one pixel 19. The pixel electrode 31 in the sub-pixel 18 is a substantially rectangular shape, and longitudinal direction thereof is disposed along the Y direction. There may be a case where the pixel electrode 31 is called the pixel electrodes 31B, 31G, and 31R depending on the light emission color.

An insulating layer 27 is formed to cover the outer edge of each of the pixel electrode 31B, 31G, and 31R. As a result, an opening 27a is formed on each of the pixel electrode 31B, 31G, and 31R, and each of the pixel electrode 31B, 31G, and 31R is exposed in the opening 27a. The opening 27a is a planar shape or a substantially rectangular shape.

Figure 4:
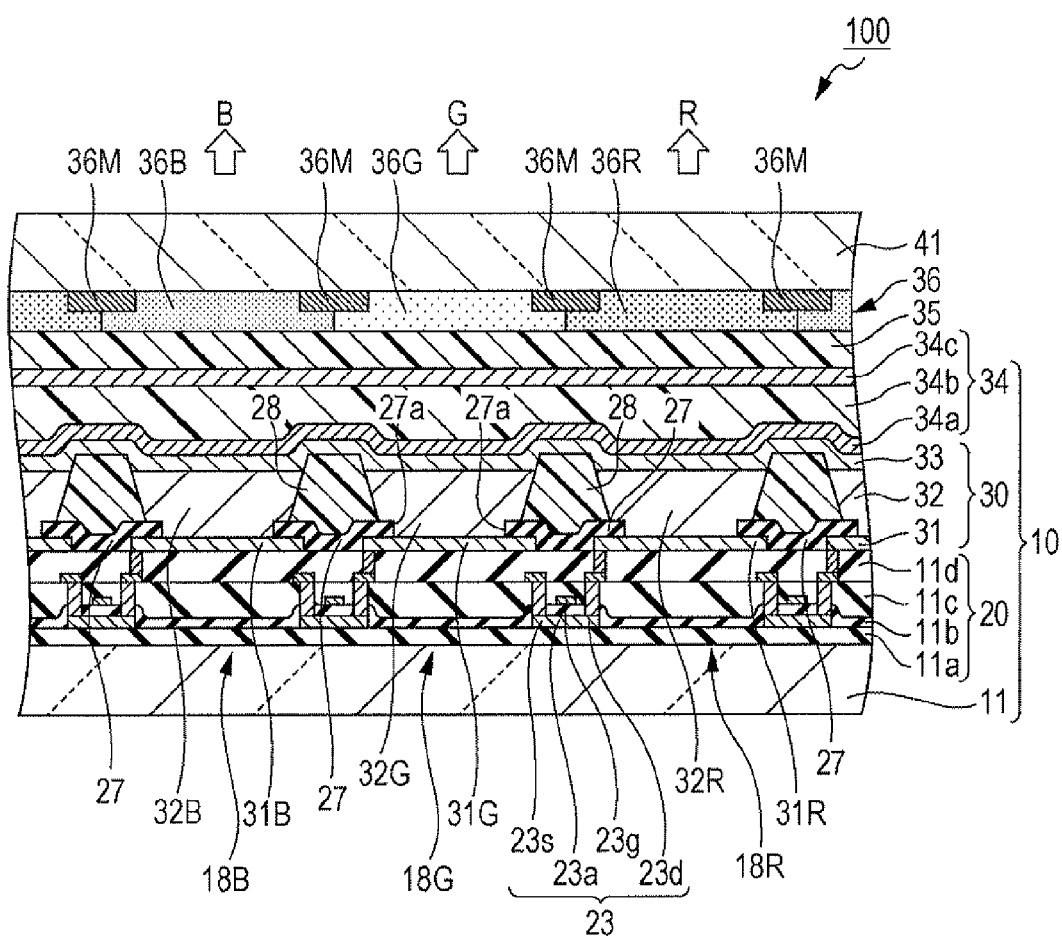
FIG. 4 is a schematic cross-sectional view illustrating a configuration of the organic EL device taken along the line IV-IV of FIG. 3.
Figure 5:
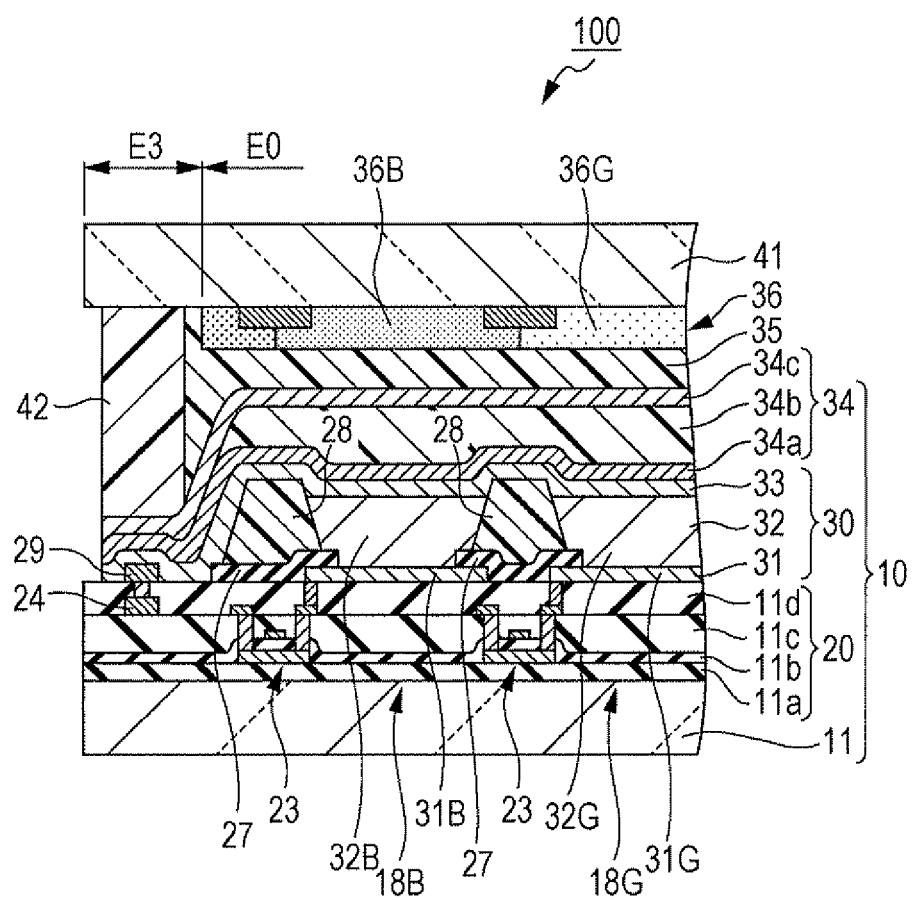
FIG. 5 is a schematic cross-sectional view illustrating the configuration of the organic EL device taken along line V-V of FIG. 2.

Next, structure of the organic EL device 100 will be described with reference to FIGS. 4 and 5. FIG. 4 is a schematic cross-sectional view illustrating the structure of the organic EL device along the line III-III of FIG. 3, and FIG. 5 a schematic cross-sectional view illustrating the structure of the organic EL device along the line II-II of FIG. 2. FIG. 4 illustrates a configuration of the sub-pixel 18 in the actual display region E1, and FIG. 5 illustrates a sealing structure in the non-display region E3.

As illustrated in FIG. 4, the organic EL device 100 includes a base material 11 and the element substrate 10 having the pixel circuits 20, the organic EL element 30, and the sealing layer 34 sealing the plurality of organic EL elements 30 which are sequentially formed on the base material 11. Moreover, the organic EL device includes an opposed substrate 41 disposed opposite with respect to the element substrate 10 via a transparent resin layer 35.

The opposed substrate 41, for example, is configured of a transparent substrate such as glass and the like, and includes a color filter 36 having a light shielding film 36M which optically separates colored layers 36B, 36G, and 36R provided to correspond to the sub-pixels 18B, 18G, and 18R of the element substrate 10 with respective colored layers 36B, 36G, and 36R.

Light emission from the light emitting functional layers 32B, 32G, and 32R of the sub-pixels 18B, 18G, and 18R is transmitted through the color filter 36 and then is extracted from the opposed substrate 41. In other words, the organic EL device 100 is a top-emission type light emitting device.

Since the organic EL device 100 is a top-emission type, a transparent substrate such as glass or an opaque substrate such as silicon or ceramics can be used as the base material 11. Hereinafter, a case where a thin film transistor is used in the pixel circuits 20 will be described as an example.

A first interlayer insulating film 11a is formed to cover the surface of the base material 11. For example, a semiconductor layer 23a of the driving transistor 23 in the pixel circuit 20 is formed on the first interlayer insulating film 11a. A second interlayer insulating film 11b functioning as a gate insulating film is formed to cover the semiconductor layer 23a. A gate electrode 23g is formed in a position facing a channel region of the semiconductor layer 23a via the second interlayer insulating film 11b. A third interlayer insulating film 11c is formed to cover the gate electrode 23g. Contact holes passing through the second interlayer insulating film 11b and the third interlayer insulating film 11c are formed to respectively correspond to a source region 23s and a drain region 23d of the semiconductor layer 23a. A conductive film is formed so as to fill the contact holes and is patterned, and a wire connected to the driving transistor 23 is formed. Although not shown in FIG. 4, the storage capacitor 22 and the switching transistor 21 in the pixel circuit 20 are also formed in the same manner.

A fourth interlayer insulating film 11d is formed to cover the third interlayer insulating film 11c. A planarization process is performed on the fourth interlayer insulating film 11d in order to eliminate surface irregularities caused by covering the driving transistor 23 and the like of the pixel circuit 20. Moreover, subsequently, the contact holes for electrically connecting the driving transistor 23 and the pixel electrode 31 are formed to pass through the fourth interlayer insulating film 11d. As a material configuring the first interlayer insulating film 11a to the fourth interlayer insulating film 11d, for example, nitride and oxide of silicon or oxynitride of silicon can be used.

A conductive film is formed to cover the fourth interlayer insulating film 11d so as to fill the contact holes formed on the fourth interlayer insulating film 11d, and the pixel electrode 31 (31B, 31G, and 31R) is formed by patterning the conductive film. For example, Al (aluminium), or Ag (silver), or an alloy of these metals, which have light reflectivity characteristics, can be used as the pixel electrode 31 (31B, 31G, and 31R). Moreover, a transparent conductive film such as ITO (Indium Tin Oxide) and the like may be used. In a case where the pixel electrode 31 (31B, 31G, and 31R) is formed using a transparent conductive layer, a reflective layer is provided between the pixel electrode 31 (31B, 31G, and 31R) and the base material 11.

The insulating layer 27 is formed to cover the outer portions of the respective pixel electrodes 31B, 31G, and 31R, and as a result, the opening 27a is formed on the respective electrodes 31B, 31G, and 31R. The insulating layer 27, for example, is formed using an oxide of silicon.

Partition walls 28 are formed on the insulating layer 27. The partition walls 28, for example, are formed so as to respectively partition the pixel electrodes 31B, 31G, and 31R at a height of approximately 1 μm to 2 μm using an acrylic photosensitive resin.

In the embodiment, since light emitting functional layers 32 (32B, 32G, and 32R) is formed by a liquid-phase process, liquid-repellent treatment is performed on a surface of the partition walls 28, and a lyophilic treatment is performed on the surfaces of the pixel electrodes 31B, 31B, 31R exposed in the region surrounded by the partition walls 28. In addition, the embodiment is not limited to employ a configuration of a so-called a bi-layer bank, which has the insulating layer 27 in the lower layer and the partition walls 28 on the upper layer, and may be the configuration of only the partition walls 28 having liquid repellency except for the insulating layer 27.

The light emitting functional layer 32 (32B, 32G, and 32R) is respectively formed in the region partitioned by the partition walls 28. The light emitting functional layer 32, for example, is formed in order of a hole injection layer, a hole transport layer, an organic light emitting layer, an electron transport layer from the pixel electrode 31. In the embodiment, for each hole injection layer, hole transport layer, and organic light emitting layer, and electron transport layer, a liquid containing a layer forming material is prepared, and the light emitting functional layer 32 (32B, 32G, and 32R) are formed in which the layers are laminated by applying and drying the liquid to a region partitioned by the partition walls 28. As a method of selectively applying the liquid with respect to a predetermined region, a droplet discharge method (ink-jet method) is used. In addition, the light emitting functional layer 32 (32B, 32G, and 32R) is not limited to be formed by the above-described droplet discharge method (ink-jet method), and may be formed by a deposition method which uses a mask having an opening corresponding to the above-described predetermined region.

In addition, light emission of blue (B) is obtained from the light emitting functional layer 32B, light emission of green (G) is obtained from the light emitting layer functional layer 32G, and light emission of red (R) is obtained from the light emitting layer functional layer 32R. Moreover, layer configuration of the light emitting functional layer 32 is not limited thereto, and may include an intermediate layer for controlling the movement of holes and electrons which are carriers. Moreover, the layer configuration not only changes a layer forming material of the organic light emitting layer but also may have a different configuration such as a hole injection layer or a hole transport layer corresponding to the light emission colors.

The opposed electrode 33 as the common cathode is formed to cover the light emitting functional layer 32 (32B, 32G, and 32R) and the partition walls 28. The opposed electrode 33, for example, is formed by forming a film thickness (e.g. 10 nm to 30 nm) of an alloy of Mg and AG to be thick enough so that the light transmittance can be obtained. As a result, the plurality of organic EL elements 30 are made.

Next, the sealing layers 34 covering the plurality of organic EL elements 30 are formed so as to prevent water or oxygen or the like from penetrating. The sealing layers 34 of the embodiment are laminated in order of the first inorganic sealing layer 34a, the buffer layer 34b, and the second inorganic sealing layer 34c from the opposed electrode 33.

As the first inorganic sealing layer 34a and the second inorganic sealing layer 34c, it is preferable to use, for example, silicon oxynitride (SiON) and the like which are inorganic materials having excellent gas barrier characteristics as well as having light transmittance.

An example of a method of forming the inorganic sealing layer includes a deposition method or a sputtering method. It is possible to achieve high gas barrier by thickening the film thickness of the inorganic sealing layer, but on the other hand, it is easy to cause cracks by expansion and contraction. Therefore, it is preferable to control the film thickness of the inorganic sealing layer to a film thickness of approximately 200 nm to 400 nm, in the embodiment, the high gas barrier characteristics are achieved by superimposing the inorganic sealing layer across the buffer layer 34b.

For example, an epoxy resin having excellent thermal stability can be used for the buffer layer 34b. Moreover, if the buffer layer 34b configured of an organic material is application-formed by a printing method such as a screen or a fixed-quantity discharging method, it is possible to planarize the surface of the buffer layer 34b. That is, the buffer layer can function even if the buffer layer 34b is a planarizing layer mitigating the irregularities of the surface of the first inorganic sealing layer 34a.

The element substrate 10 and the opposed substrate 41 are disposed to oppose each other at intervals, and the transparent resin layer 35 is formed by filling a transparent resin in the intervals. Examples of the transparent resin include resins such as urethane base, acrylic base, epoxy base, and polyolefin base, and the like.

As illustrated in FIG. 5, in the non-display region E3, the wiring layer 24 is provided on the third interlayer insulating film 11c of the base material 11. The contact portion 29 is provided on the fourth interlayer insulating film 11d. The wiring layer 24 and the contact portion 29 are electrically connected each other via the contact holes formed on the fourth interlayer insulating film 11d. In addition, the configuration of the wiring layer 24 and the contact portion 29 is not limited thereto, for example, the wiring layer 24 may be formed on the fourth interlayer insulating film 11d and the contact portion 29 may be formed so as to be in contact with the wiring layer 24. Alternatively, since the fourth interlayer insulating film 11d is formed in a range narrower than the base material 11, the contact portion 29 may be formed so as to be in contact with the wiring layer 24 in the outer edge of the fourth interlayer insulating film 11d (region between the outer edge of the fourth interlayer insulating film 11d and the outer edge of the base material 11 when viewed in plan).

The opposed electrode 33 as a common electrode is formed over the display region E0 and the non-display region E3. In the non-display region E3, the opposed electrode 33 is formed so as to be in contact with the contact portion 29 and the fourth interlayer insulating film 11d.

Of the sealing layers 34, the first inorganic sealing layer 34a and the second inorganic sealing layer 34c are in contact with each other in the non-display region E3 and formed so as to overlap the opposed electrode 33. The buffer layer 34b is laminated on the first inorganic sealing layer 34a so as to overlap at least the display region E0.

When the element substrate 10 in which the plurality of the organic EL elements 30 are provided is adhered to oppose the opposed substrate 41 having a color filter 36 via the transparent resin layer 35, a dam material 42 is provided so as to surround the display region E0 in the non-display region E3. A thermosetting adhesive mainly composed of epoxy resin can be used as the dam material 42.

Method of Manufacturing Light Emitting Apparatus

Figure 6:
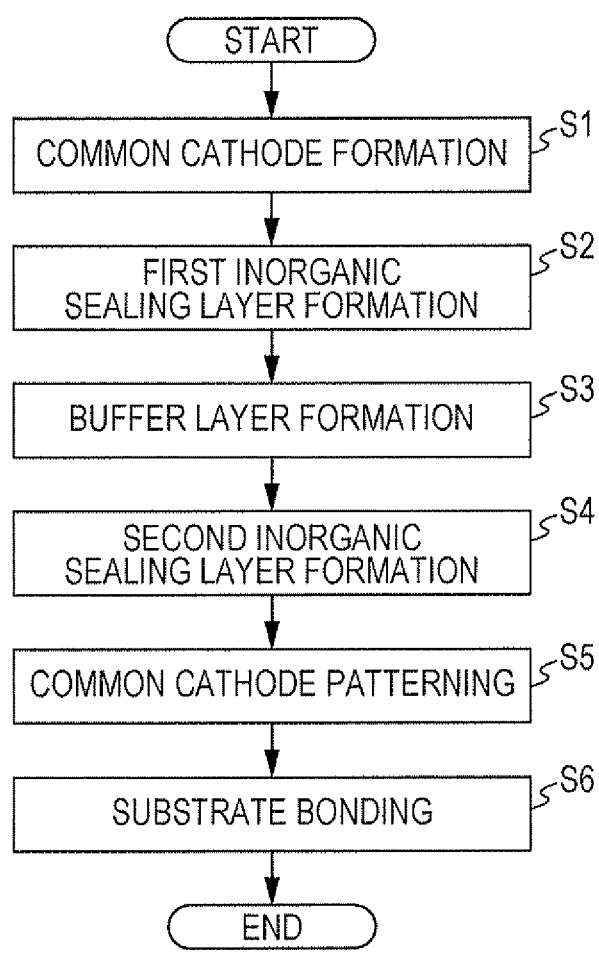
FIG. 6 is a flow chart illustrating a method of manufacturing the organic EL device of the first embodiment.

Next, a method of manufacturing an organic EL device 100 as a method of manufacturing a light emitting device of the embodiment will be described with reference to FIGS. 6 and 7. FIG. 6 is a flow chart illustrating a method of manufacturing an organic EL device of a first embodiment, and FIGS. 7A to 7E are schematic cross-sectional views illustrating a method of manufacturing the organic EL device of the first embodiment. In addition, FIG. 7 is equivalent to a cross-sectional view of the element substrate 10 taken along line VII-VII of FIG. 2.

As illustrated in FIG. 6, the method of the organic EL device 100 as the method of manufacturing the light emitting device of the embodiment has a common cathode forming step (step S1), a first inorganic sealing layer forming step (step S2), a buffer forming step (step S3), and a second inorganic sealing layer forming step (step S4), a common cathode patterning step (step S5), and a substrate bonding step of bonding the element substrate 10 and the opposed substrate 41 (step S6).

In addition, in the element substrate 10, as described above, a known method can be used for a step of forming the pixel circuit 20, and a step of forming the pixel electrode 31 and the functional layer 32 of the organic EL element 30. Therefore, in the embodiment, the steps after the common cathode step, which are a feature of the present application, will be described.

Figure 7A:
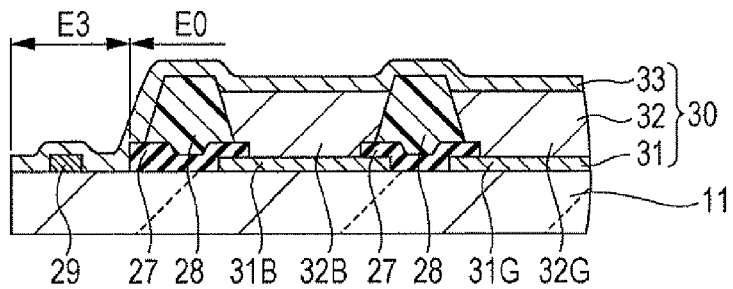
FIGS. 7A to 7E are schematic cross-sectional views illustrating a method of manufacturing the organic EL device of the first embodiment.

In the common cathode forming step (step S1) of FIG. 6, as illustrated in FIG. 7A, the opposed electrode 33 as the common cathode is formed over the display region E0 and the non-display region E3. The opposed electrode 33 is formed so as to be in contact with the light emitting functional layer 32 and the partition wall 28 and cover the light emitting functional layer and the partition wall in the display region E0, for example, by depositing or sputtering an alloy (MgAg) of Mg and Ag. In the non-display region E3, the opposed electrode is formed so as to be in contact with at least the contact portion 29 and cover the contact portion. Light transmittance in addition to conductivity is given to the opposed electrode 33 by forming a film thickness as thin as 10 nm to 30 nm. Then, step S2 proceeds.

Figure 7B:
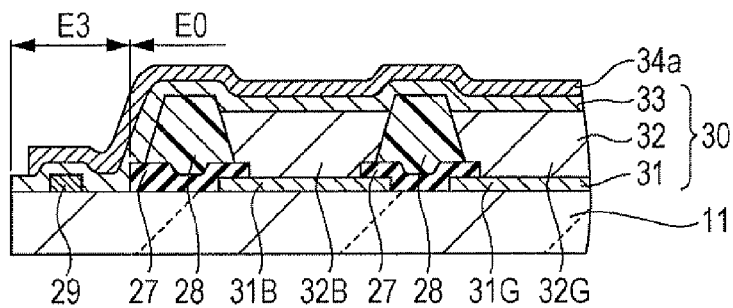

In the first inorganic sealing forming process (step S2) of FIG. 6, as illustrated in FIG. 7B, the first inorganic sealing layer 34a is formed over the display region E0 and the non-display region E3. The first inorganic sealing layer 34a, is formed so as to be in contact with the opposed electrode 33 and cover the opposed electrode, for example, by depositing or sputtering SiON (silicon oxynitride). However, in the non-display region E3, the first inorganic sealing layer is formed so as to overlap the contact portion 29 via the opposed electrode 33, and to expose the outer edge of the opposed electrode 33. That is, the first inorganic sealing layer 34a is formed inwards from a region where the opposed electrode 33 is formed. Such a selective formation of the first inorganic sealing layer 34a, for example, can be realized by deposition or sputtering using the mask having the opening corresponding to the region where the first inorganic sealing layer 34a is formed. The film thickness of the first inorganic sealing layer 34a is 200 nm to 400 nm. Then, step S3 proceeds.

Figure 7C:
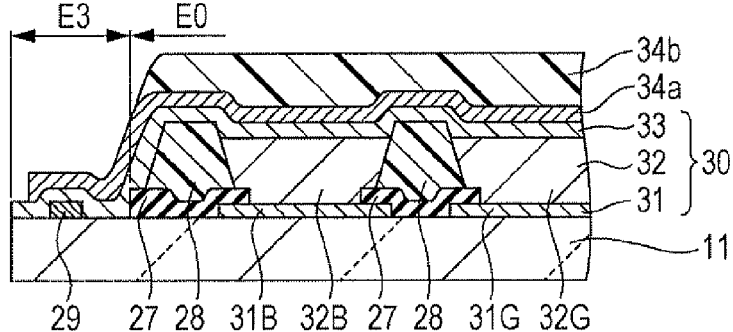

In the buffer forming step (step S3) of FIG. 6, as illustrated in FIG. 7C, the buffer layer 34b is formed over at least the display region E0. The buffer layer 34b is formed so as to be in contact with the first inorganic sealing layer 34a and cover the first inorganic sealing layer, for example, by printing or fixed-quantity discharging method such as screening and fixed-quantity discharging method such as the epoxy-based resin (including monomer, oligomer, and curing agent) having the light transmittance. It is preferable to employ the fixed-quantity discharging method in that a printing unit such as the screening is not touched in the first inorganic sealing layer 34a. For example, the buffer layer 34b is formed by adding a solvent to the epoxy resin and thoroughly discharging a solution adjusted to a dischargeable viscosity to the display region E0 from a nozzle. The buffer layer 34b is formed by drying the applied solution. The planar buffer layer 34b in which the surface thereof is relatively planar after drying can be obtained by being leveled in the process of drying the solution. In a case where a foreign matter is mixed in the film thickness of the buffer layer 34b, it is preferable that the film thickness be 1 μm to 3 μm so that the formation of the second inorganic sealing layer 34c formed after the process is not affected. Then, step S4 proceeds.

Figure 7D:
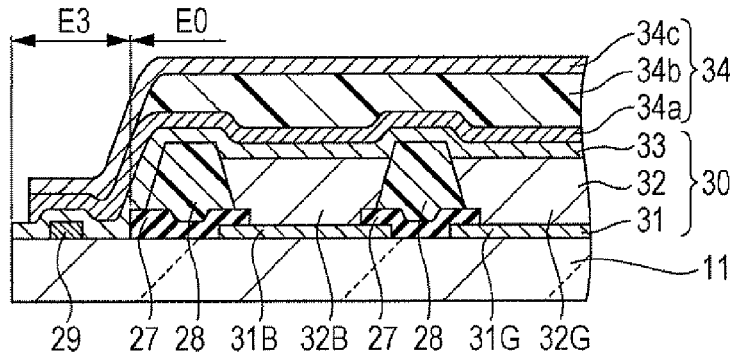

In the second inorganic sealing layer forming step (step S4) in FIG. 6, as illustrated in FIG. 7D, the second inorganic sealing layer 34c is formed over the display region EU and the non-display region E3. It is desirable that the second inorganic sealing layer 34c be formed using the same material as the first inorganic sealing layer 34a, and as a result, SiON is preferably used. The second inorganic sealing layer is formed so as to be in contact with the buffer layer 34b and cover the buffer layer in the display region E0, and is formed so as to be in contact with the first inorganic sealing layer 34a in the non-display region E3. The second inorganic sealing layer 34c is formed in the same region where the first inorganic sealing layer 34a is formed or slightly inwards from the region. Such a selective formation of the second inorganic sealing layer 34c can be also realized by deposition or sputtering using a mask. The film thickness of the second inorganic sealing layer 34c is 200 nm to 400 nm. As a result, the sealing layer 34 is made. Step S2 to step S4 correspond to the step of forming the sealing layer 34. Then, step S5 proceeds.

Figure 7E:
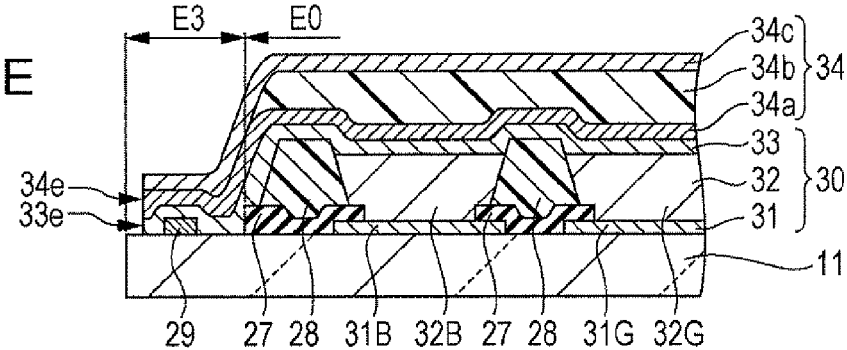

In the common cathode patterning step of FIG. 6 (step S5), as illustrated in FIG. 7E, patterning is performed by etching the opposed electrode 33 which is the common cathode using the sealing layer 34 as the mask. As a method of etching the opposed electrode 33, a dry-etching using treatment gas containing oxygen can be taken as an example. The opposed electrode 33 having a thickness thinner than that of the sealing layer 34 is preferentially etched by performing the dry-etching in which the sealing layer 34 is used as the mask, a cross-sectional shape in which an end portion 33e of the opposed electrode 33 and an end portion 34e of the sealing layer 34 are gathered is realized in the non-display region E3. Moreover, at this time, the end portion 33e, which is not covered by the sealing layer 34, of the opposed electrode 33 is passivated by the oxygen contained in the treatment gas. Since the contact portion 29 in contact with the opposed electrode 33 is inwards (display region E0) from the end portion 33e of the opposed electrode 33, the contact portion is not passivated by oxygen. Then, step S6 proceeds.

In the substrate bonding step (step S6) of FIG. 6, as illustrated in FIG. 5, the element substrate 10 in which the sealing layer 34 seals the plurality of the organic EL elements 30 and the opposed substrate 41 having the color filter 36 are bonded via the transparent resin layer 35. The bonding method, for example, is to dispose the dam material 42, which is the thermosetting adhesive, in the element substrate 10 or in the non-displayed region E3 of the opposed substrate 41, and is to apply a predetermined amount of transparent resin inwards from the dam material 42 of the substrate in which the dam material 42 is disposed. Then, the two substrates are disposed opposite at a predetermined position, and the dam material 42 is heat-cured. As a result, the transparent resin layer 35 is formed between the element substrate 10 and the opposed substrate 41. It is possible to prevent the transparent resin from protruding outwards from the two substrates and to adhere the two substrates by the compression at a predetermined interval by disposing the dam material 42 in the non-display region E3. It is desirable that the dam material 42 include a gap material for disposing the two substrates at a predetermined interval.

According to the first embodiment, the following effects can be obtained.

(1) According to the organic EL device 100 and the method of manufacturing the same, the sealing layer 34 is not formed to cover the end portion 33e of the opposed electrode 33 in the non-display region E3. As a result, the sealing layer is formed in the same region where the opposed electrode 33 is formed or inwards the region (display region E0). Therefore, compared with a case where the sealing layer 34 is formed so as to cover the end portion 33e of the opposed electrode 33, the width of the X and Y directions of the non-display area E3 can be narrowed (reduced). That is, while reliability in light-emission lifetime is ensured, the organic EL device 100 as a compact light emitting device can be provided.

(2) The opposed electrode 33 is patterned by dry-etching the sealing layer 34 as the mask. As a result, the end portion 33e, which is not covered by the sealing layer 34, of the opposed electrode 33 is passivated by the oxygen contained in the treatment gas. Thereafter, even if the end portion 33e of the opposed electrode 33 is touched by the oxygen or the water, it is possible to prevent the oxygen or water from penetrating into the display region E0 since the end portion is passivated. Moreover, since the contact portion 29 is disposed inwards (display region E0) from the passivated end portion 33e of the opposed electrode 33, it is possible to more reliably suppress the penetration of water or oxygen to the display region E0.

(3) The sealing layer 34 which covers and seals the plurality of the organic EL elements 30 is a laminated structure of the first inorganic sealing layer 34a, the butter layer 34b, the second inorganic sealing layer 34c from the opposed electrode 33. Therefore, compared with a case where the sealing layer 34 is a thick film simply configured of an inorganic material, disadvantages such as cracks or peeling due to thermal expansion and contraction are decreased. Therefore, it is possible to reliably suppress the penetration of water or oxygen. Moreover, the buffer layer 34b is formed using an organic material by a coating method. Therefore, even if the irregularities are generated on the surface of the first inorganic sealing layer 34a under the influence of the plurality of organic EL elements 30, it is possible to function the buffer layer 34b as the planarizing layer mitigating the irregularities.

(4) The element substrate 10 and the opposed substrate 41 are bonded by the dam material 42 via the transparent resin layer 35. Therefore, it is possible to prevent the transparent resin from protruding outwards from the two substrates.

Moreover, since the element substrate 10 and the opposed substrate 41 can be strongly bonded each other, the plurality of organic EL elements 30 can be reliably sealed.

(5) In the opposed substrate 41 disposed opposite to the element substrate 10, the color filter 36 having colored layers 36B, 36G, and 36R respectively corresponding to the sub-pixels 18B, 18G, and 18R is provided. Light emitted from the light emitting functional layers 32B, 32G, and 32R goes through the colored layer 36B, 36G, and 36R. Therefore, the EL device 100 capable of displaying full color at a high purity can be provided.

Second Embodiment

Light Emitting Apparatus

Figure 8:
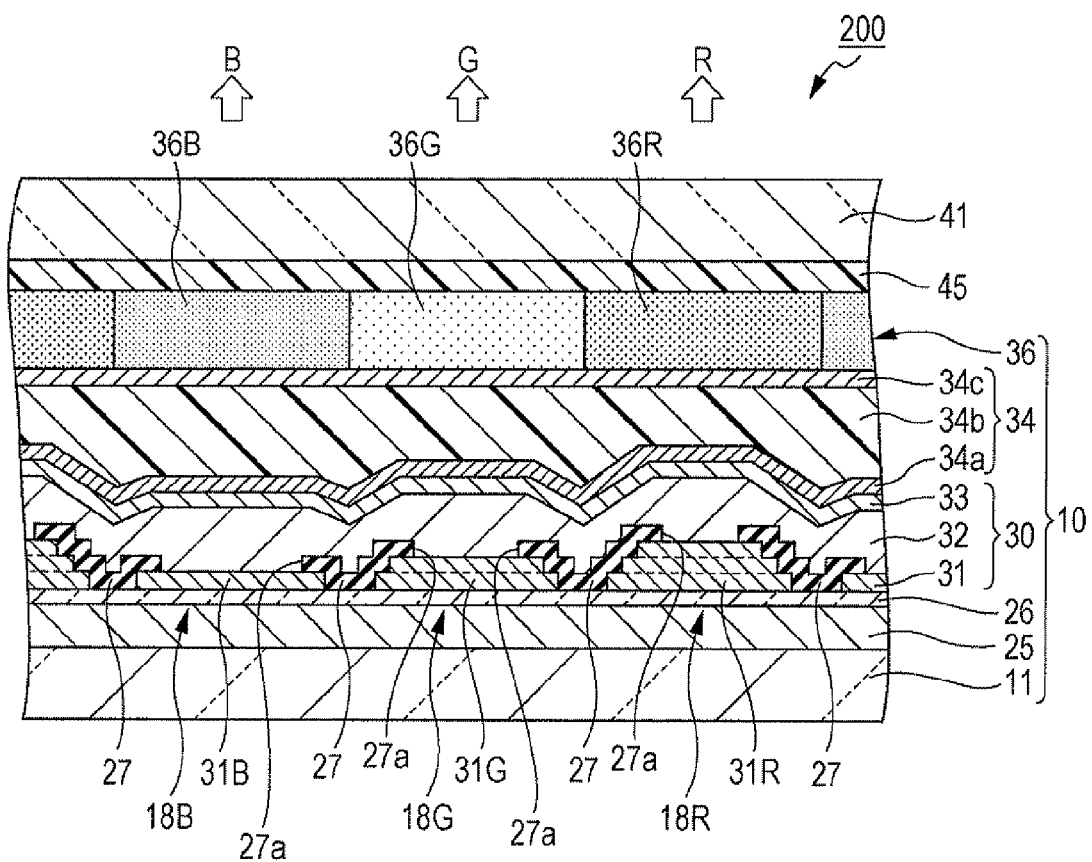
FIG. 8 is a schematic cross-sectional view illustrating the configuration of the organic EL device of the second embodiment.

Next, an organic EL device as a light emitting device of a second embodiment will be described with reference to FIGS. 8 and 9. FIG. 8 is a schematic sectional view illustrating a structure of the organic EL device of the second embodiment, and FIGS. 9A and 9B are schematic sectional views illustrating the structure of the non-display region of the organic EL device of the second embodiment. In addition, the organic EL device as the light emitting device of the second embodiment has a different configuration from the element substrate 10 with respect to the organic EL device 100 of the first embodiment. FIG. 8 corresponds to a sectional view taken along the line VIII-VIII of FIG. 3, and FIGS. 9A and 9B correspond to a sectional view taken along the lines IXA-IXA and IXB-IXB of FIG. 2. Therefore, the same reference numerals will be given to the same configurations as the first embodiment and detailed descriptions will be omitted. Moreover, in FIGS. 8 and 9, the display of the driving transistor 23 and the like of the pixel circuit 20 formed on the base material 11 will be omitted.

As illustrated in FIG. 8, an organic EL device 200 as the light emitting device of the present embodiment has a base material 11, a reflective layer 25 sequentially formed on the base material 11, a transparent layer 26, pixel electrodes 31B, 31G, and 31R, a light emitting functional layer 32, and an opposed electrode 33 as a common cathode, which are sequentially formed on the base material 11. Moreover, the organic EL device has a sealing layer 34 covering the opposed electrode 33 and a color filter 36 formed on the sealing layer 34. Further, the organic EL device has an opposed substrate 41 disposed on the element substrate 10 via a transparent resin layer 45 in order to protect the color filter 36. The element substrate 10 of the embodiment includes from the base material 11 to the color filter 36.

The pixel electrodes 31B, 31G, and 31R provided to correspond to the sub-pixels 18B, 18G, 18R, for example, are configured of a transparent conductive film such as ITO or the like, and have different film thicknesses one another. The film thickness is thicker in order of blue (B), green (G), and red (R).

The light emitting functional layer 32 is formed in common across the sub-pixels 18B, 18G, and 18R, and is configured to obtain white light emission.

The opposed electrode 33 covering the light emitting functional layer 32 is configured of, for example, an MgAg alloy, and the film thickness thereof is controlled so as to combine light transmission and light reflectivity.

The organic EL device 200 of the embodiment is configured to have an optical resonator between the reflective layer 25 and the opposed electrode 33. Due to the difference in film thicknesses of the pixel electrodes 31B, 31G, and 31R for each sub-pixels 18B, 18G, and 18R, an optical distance in each light resonator is different. As a result, the organic EL device is configured to obtain resonance-wavelength light corresponding to each color in respective sub-pixels 18B, 18G, and 18R.

Respective colored layers 36B, 36G, and 36R of the color filter 36 are formed directly on the sealing layer 34.

The resonance light emitted from the optical resonators of respective sub-pixels 18B, 18G, 18R transmits the respective colored layer 36B, 36G, and 36R, and then is emitted from the transparent opposed substrate 41. Since the color filter 36 is formed on the sealing layer 34, color mixture due to light leakage between the sub-pixels 18B, 18G, and 18R is decreased. Such a configuration of the sub-pixels 18B, 18G, and 18R can effectively decrease the color mixture as the planar sizes of the sub-pixels 18B, 18G, and 18R become smaller.

As illustrated in FIG. 9A, in the non-display region E3, the opposed electrode 33 is formed so as to be in contact with the contact portion 29 and cover the contact portion. The first inorganic sealing layer 34a of the sealing layer 34 is formed so as to be in contact with the opposed electrode 33 and cover the opposed electrode. However, the end portion 33e of the opposed electrode 33 is not covered by the first inorganic sealing layer 34a. The second inorganic sealing layer 34c formed with respect to the first inorganic sealing layer 34a via the buffer layer 34b is laminated in contact with the first inorganic sealing layer 34a in the non-display region E3. The element substrate 10 and the opposed substrate 41 are bonded by the dam material 42 disposed in the non-display region E3.

FIG. 9A illustrates a cross-sectional shape in which the end portion 33e of the opposed electrode 33 and the end portion 34e of the sealing layer 34 are gathered. Moreover, the end portion of the opposed electrode and the end portion of the sealing layer are also gathered with respect to the end of the dam material 42. In other words, since the sealing layer 34 does not necessarily cover the end portion 33e of the opposed electrode 33, and the dam material 42 does not necessarily cover the end portion 33e of the opposed electrode 33 or the end portion 34e of the sealing layer 34, compared with a case where the end portions 33e and 34e are formed to be covered, the width of the non-display region E3 can be decreased.

In addition, the end portion 33e of the opposed electrode 33 and the end portion 34e of the sealing layer 34 are not necessarily gathered in the cross-sectional shape, for example, as illustrated in FIG. 9B, the sealing layer 34 may be formed inwards (display region E0) from the region where the opposed electrode 33 is formed, and a step may occur between the end portion 33e of the opposed electrode 33 and the end portion 34e of the sealing layer 34.

Moreover, in a case of the dam material 42 adhering the element substrate 10 and the opposed substrate 41, the end of the dam material 42 is not necessarily gathered and disposed with respect to the end portion 33e of the opposed electrode 33. The dam material 42 may be disposed to the display region E0 from the end portion 33e of the opposed electrode 33.

In the embodiment, similarly to the first embodiment, the portion, which is not covered by the sealing layer 34, of the opposed electrode 33 (including the end portion 33e) is passivated. Details will be described in the method of manufacturing the following organic EL device 200.

Method of manufacturing Light Emitting Apparatus

Figure 10:
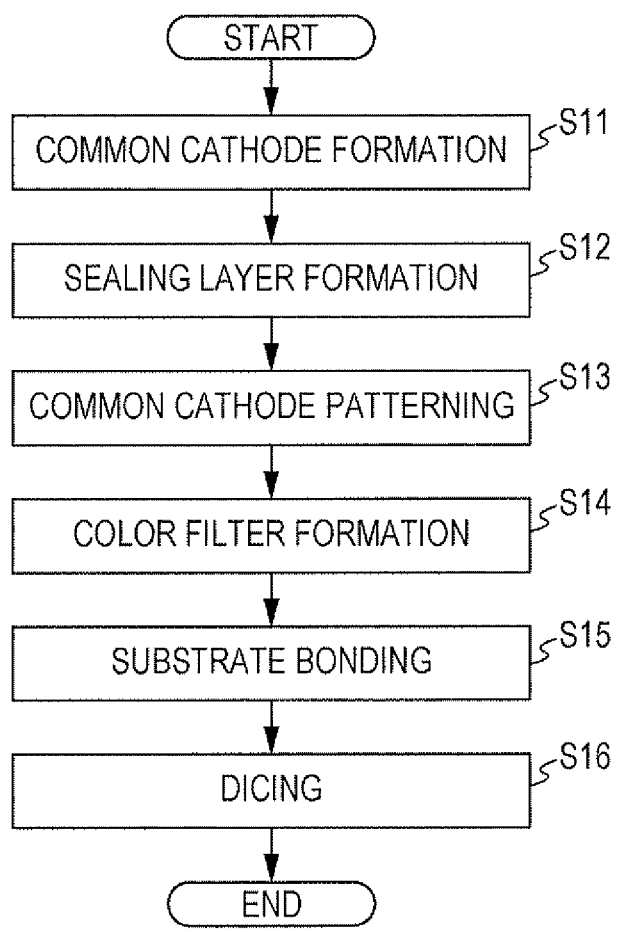
FIG. 10 is a flow chart illustrating the method of manufacturing the organic EL device of the second embodiment.

The method of manufacturing the organic EL device 200 as the method of manufacturing the light emitting device of the second embodiment will be described with reference to FIGS. 10 to 12. FIG. 10 is a flow chart illustrating the method of manufacturing the organic EL device of the second embodiment, FIG. 11 is a schematic plan view illustrating the configuration of the mother substrate, and FIGS. 12A to 12E are schematic views illustrating the method of manufacturing the organic EL device of the second embodiment.

As illustrated in FIG. 10, the method of manufacturing the organic EL device 200 of the embodiment has a common cathode forming step (step S11), a sealing layer forming step (step 12), a common cathode patterning step (step S13), a color filter forming step (step S14), a substrate boding step (step S15), and a dicing step (step S16).

Figure 11:
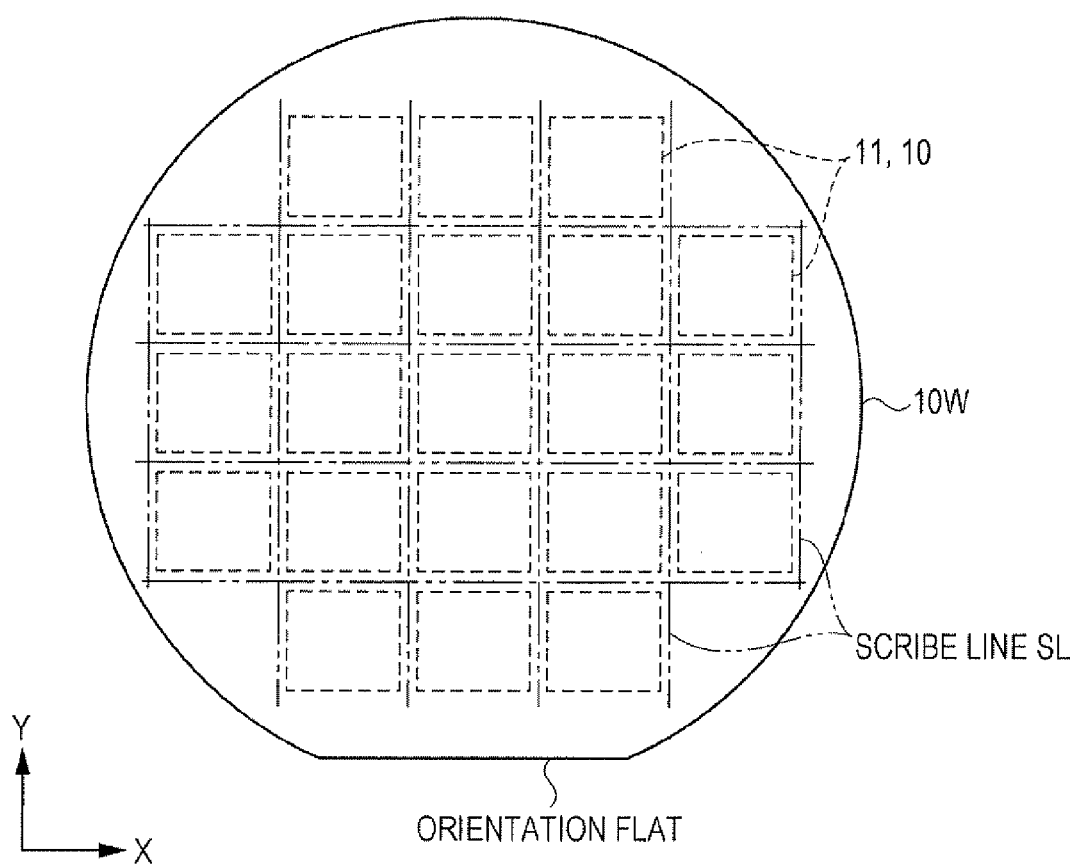
FIG. 11 is a schematic plan view illustrating the configuration of a mother substrate.

In the embodiment, as illustrated in FIG. 11, in terms of design, the organic EL device 200 is manufactured on the mother substrate 10W on which the base material 11 of the element substrate 10 is imposed in a plural number. In the mother substrate 10W, considering the direction in which a cut surface of an orientation flat extends as the X direction, the plurality of the base materials 11 are imposed in the X and Y directions at a predetermined interval. Each configuration of the element substrate 10 is formed on the base material 11, and each opposed substrate 41 is bonded with respect to each element substrate 10. Then, the organic device 200 is respectively extracted by being diced along the scribe line (virtual cut line) set in the interval extending in the X and Y directions.

Since the organic EL device 200 of the embodiment is a top-emission type, for example, a substrate such as transparent quartz or alkali-free glass or the like, or a substrate such as opaque silicon can be used for the mother substrate 10W. In the embodiment, a transistor or the like of the sub-pixel circuit 20 is formed on the mother substrate 10W using a quartz substrate as the mother substrate 10W and using a high-temperature process. A known method can be used for the method of forming the pixel circuit 20.

In addition, FIGS. 12A to 12E illustrate a schematic cross-sectional view of the base material 11 adjacent to each other in the X direction of the mother substrate 10W. Moreover, FIGS. 12A to 12E omit the display of the pixel circuit 20 or pixel electrode 31 or the like in the element substrate 10, and comprehensibly display the contents after the common cathode forming step according to the embodiment.

Figure 12A:
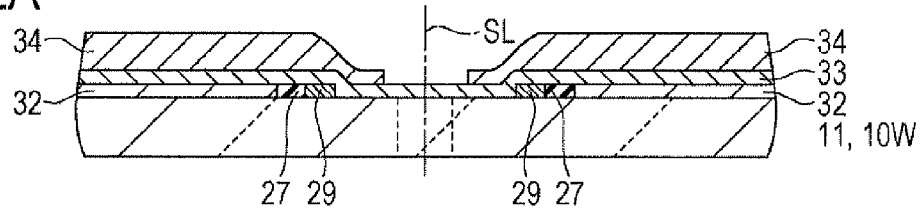
FIG. 12A to 12E are schematic cross-sectional views illustrating the method of manufacturing the organic EL device of the second embodiment.

Specifically, in the common cathode forming step (step S11) of FIG. 10, as illustrated in FIG. 12A, the opposed electrode 33 as the common cathode is formed over the entire surface of the mother substrate 10W so as to cover the plurality of insulating layers 27, contact portions 29, and light emitting functional layers 32 of the base material 11. The opposed electrode 33, as described above, for example, is formed by the deposition or the sputtering using an MgAg alloy, the thickness thereof, for example, is 10 nm to 30 nm so as to combine light transmittance and light reflectivity. Then, step S12 proceeds.

In the sealing layer forming step (step S12) of FIG. 10, as illustrated in FIG. 12A, the sealing layer 34 is formed with respective to the respective base materials 11 across a scribe line SL at intervals. The sealing layer forming step of the embodiment has the first inorganic sealing layer forming step, the buffer layer forming step, and the second inorganic sealing layer forming step. In addition, since the sealing layer forming step of the embodiment is basically the same as the step S2 to the step S4 of the first embodiment, detailed description will be omitted. Then, step S13 proceeds.

Figure 12B:
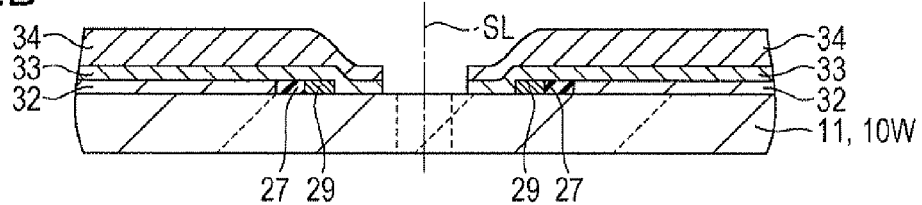

In the common cathode patterning step (step S13) of FIG. 10, as illustrated in FIG. 12B, the opposed electrode 33 is etched and patterned using the sealing layer 34 as the mask. The dry-etching method using the treatment gas containing oxygen in the same manner as in step S5 of the first embodiment can be employed to the etching method. Therefore, after the dry-etching the portion, which is not covered by the sealing layer 34, of the opposed electrode 33 (including the end portion 33e) is passivated by reaction with oxygen. Then, step S14 proceeds.

Figure 12C:
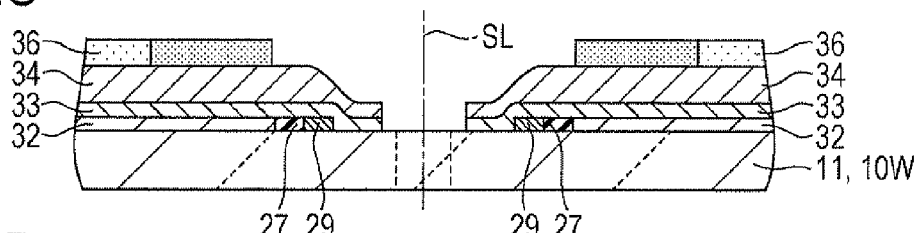

In the color filter forming step (step S14) of FIG. 10, as illustrated in FIG. 12C, the color filter 36 is formed on the sealing layer 34. In the method of forming the color filter 36, the colored layers 36B, 36G, and 36R are respectively formed by applying a photosensitive resin material including a colorant corresponding to the colored layers 36B, 36G, and 36R to the mother substrate 10W using a method such as a method of spin-coating, by exposing, developing, and drying the photo sensitive resin material. The film thicknesses of the colored layers 36B, 36G, and 36R are approximately 2 µm. Then, step S15 proceeds.

Figure 12D:
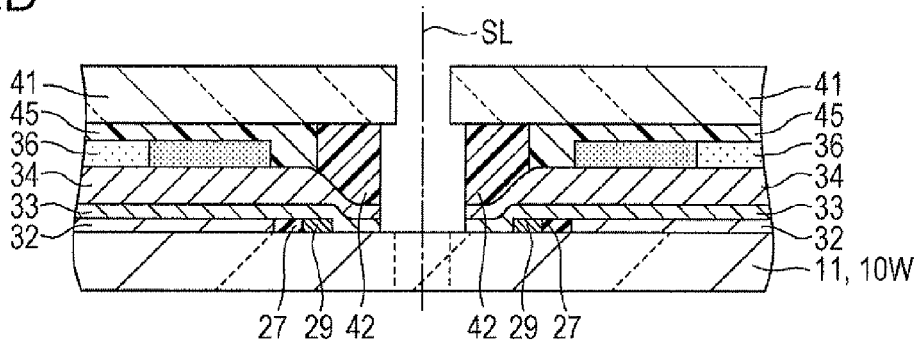

In the substrate bonding step (step S15) of FIG. 10, as illustrated in FIG. 12D, the dam materials 42 are disposed for each base material 11 of the mother substrate 10W. A predetermined amount of transparent resin material is applied to the interior of the disposed dam material 42, and the opposed substrate 41 is bonded. In the embodiment, the dam materials 42 are disposed for each base material 11 of the mother substrate 10W at a predetermined position (predetermined position surrounding display region E0). Then, the dam material 42 is hardened by pressing and heating the opposed substrates 41 disposed opposite for each base material 11 to the base material 11, and the plurality of the opposed substrates 41 are bonded on the mother substrate 10W. As a result, the transparent resin material is filled between the mother substrate 10W and the opposed substrate 41, thereby forming the transparent resin layer 45. Then, step S16 proceeds.

Figure 12E:
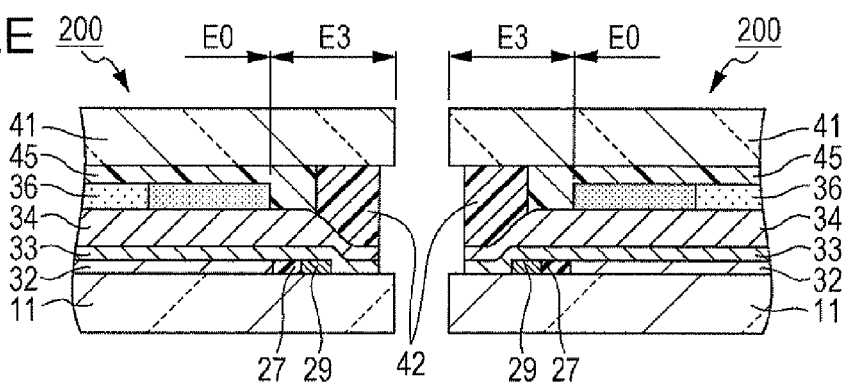

In the dicing step (step S16) of FIG. 10, as illustrated in FIG. 12E, the organic EL device 200 are respectively extracted by dicing and cutting the mother substrate 10W along the scribe line SL. Dicing is performed while cutting the margin of the intervals provided around the base material 11 imposed on the mother substrate 10W. Therefore, the opposed electrode 33 and the sealing layer 34 are not cut by a dicing blade.

In addition, in the embodiment, the unit pieces of the opposed substrate 41 are respectively bonded to the base materials 11 imposed on the mother substrate 10W. However, the method of extracting the organic EL device 200 by bonding the mother opposed substrate on which the opposed substrate 41 is imposed and the mother substrate 10W and cutting of the two substrates may be employed. Moreover, cutting of the substrates are not limited to the dicing, an incision scribe scored by a carbide chip or a laser scribe cutting by irradiating a laser beam can be used, and a combination of these cutting methods can be also used.

According to the organic EL device 200 and the method of manufacturing the same of the second embodiment, the following effects can be obtained in addition to effect similar to the effects (1), (2), and (3) of the first embodiment.

(6) The organic EL device 200 has the optical resonator and the colored layers 36B, 36G, and 36R for each sub-pixel 18B, 18G, and 18R in the element substrate 10. Therefore, compared with a case where the colored layers 36B, 36G, 36R are provided on the opposed substrate 41, the color filter 36 is disposed closely with respect to the organic EL element 30, and since the color mixture due to light leakage between the sup-pixels 18B, 18G, and 18R is decreased, the more compact organic EL device 200 having excellent display quality can be provided.

(7) In the dicing step (step S16), the dicing is performed while cutting the margin of the intervals provided in the vicinity of the base material 11 imposed on the mother substrate 10W. Therefore, since the opposed electrode 33 and the sealing layer 34 are not damaged by cutting and are not peeled off from the base material 11, the high reliability can be realized.

(8) In the common cathode patterning step (step S13), since a portion, which is not covered by the sealing layer 34, of the electrode 33 (including end portion 33e) is passivated, when being in contact with water in the dicing step (step S16), the opposed electrode 33 is hardly affected by the water.

Third Embodiment

Electronic Device

Figure 13:
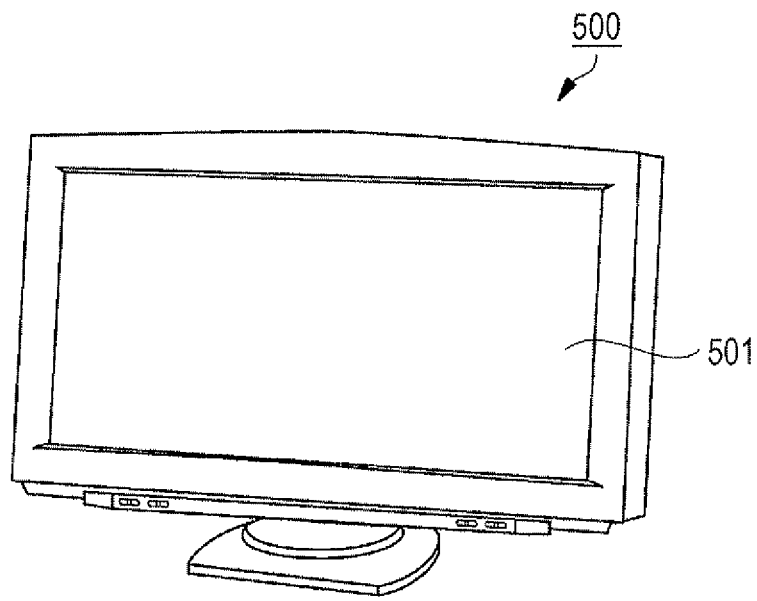
FIG. 13 is a schematic view illustrating a television as an electronic apparatus.

Next, an electronic apparatus of the present embodiment will be described with reference to FIGS. 13 and 14. FIG. 13 is a schematic view illustrating a television as electronic apparatus, and FIG. 14 is a perspective view illustrating a head-mounting display as electronic apparatus.

As illustrated in FIG. 13, a television (TV) 500 as electronic apparatus of the embodiment is configured to use the organic EL device 100 of the above-described embodiment for the display unit 501. Therefore, since the high reliability can be obtained in the emission lifetime and the width of the non-display region E3 is narrow, as long as a screen size is the same, the TV 500 which is more compact compared to a television of the related art can be provided. Moreover, compared with a case where a liquid crystal display device is employed to the display unit 501, since an illuminating device is not necessary, the thinner TV 500 can be realized.

Figure 14:
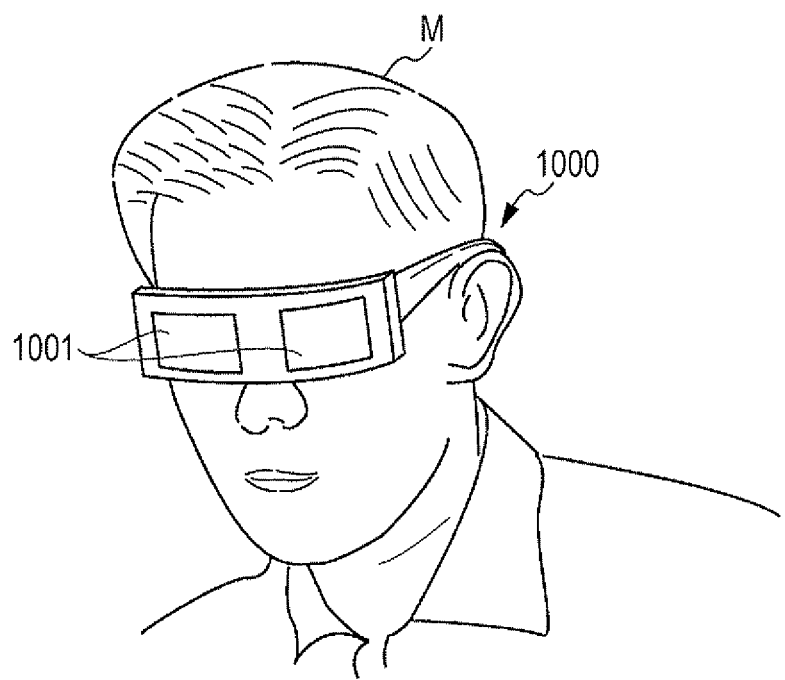
FIG. 14 is a perspective view illustrating a head-mounted display as an electronic apparatus.

As illustrated in FIG. 14, the head-mounting display 1000 as electronic apparatus of the embodiment has two display units 1001 provided to correspond to left and right eyes. An observer M can view characters or images displayed on the display units 1001 by mounting the head-mounting display 1000 on his or her head like glasses. For example, images in which a parallax is considered is displayed on the left and right display units 1001, and it is possible to enjoy watching three-dimensional images.

In the display unit 1001, the above-described organic EL device 200 is installed. Therefore, the high reliability can be obtained, the head-mounting display 1000 which is more compact and lighter compared to a display of the related art can be provided.

The head-mounting display 1000 is not limited to have the two display units 1001, and may be configured to have one display unit 1001 corresponding to any one of the left and right.

In addition, the electronic apparatus in which organic EL device 100 or the organic EL device 200 is installed is not limited to the TV 500 or the head-mounting display 1000. As examples, there are electronic apparatus having a display unit such as a personal computer, a portable formation terminal, a navigator, a viewer, and a head-up display, and the like.

The aspects of the invention are not limited to the above-described embodiments, and can be changed as appropriate within a range that does not depart from the scope or the idea of the invention that can be understood from the claims and the entirety of the specification, and the electronic apparatus that applies the light emitting device and the method of manufacturing the same accompanying such changes to the light emitting device is also included in the technical range of the aspect of the invention. Various modification examples can be considered in addition to the above-described embodiments. Hereinafter, the modification examples will be described.

Modification Example 1

In the buffer layer forming step (step S3) of the above-described first embodiment, before the buffer layer 34b is formed by a coating method, a plasma treatment using oxygen as treatment gas can be performed with respect to the base material 11 on which the first inorganic sealing layer 34a is formed. As a result, the surface of the first inorganic sealing layer 34a is cleaned and an adhesion with the buffer layer 34b increases. Moreover, the portion, which is not covered by the first inorganic sealing layer 34a, of the opposed electrode 33 can be passivated by the plasma treatment. In other words, a step of passivating the portion, which is not covered by the sealing layer 34, of the opposed electrode 33 is not limited to the common cathode patterning step using the dry-etching. For example, although depending on the environmental conditions, there may be a case where the portion in which the opposed electrode 33 is exposed is passivated by reaction with oxygen in the atmosphere.

Modification Example 2

In the above-described first embodiment and the above-described second embodiment, the buffer layer 34b of the sealing layer 34 is configured of an organic material, but is not limited thereto with respect to a stress given to the first inorganic sealing layer 34a of the sealing layer 34 and the second inorganic sealing layer 34c during the manufacturing, the buffer layer 34b can be configured of an inorganic material as long as the inorganic material has accommodative physical characteristics (e.g., elasticity).

Modification Example 3

In the above-described first embodiment and the above-described second embodiment, the method of patterning the opposed electrode 33 in the common cathode patterning step is not limited to the dry-etching in which the sealing layer 34 is used as a mask. For example, a resist pattern for etching may be formed by covering the sealing layer 34, and the opposed electrode 33 may be patterned by wet-etching. In that case, there may be a case of being a cross-sectional shape in which the end portion 33e of the opposed electrode 33 after the etching and the end portion 34e of the sealing layer 34 are not necessarily gathered.

Modification Example 4

In the organic EL device 100 of the above-described first embodiment, the contact portion 29 conducting an electrical connection between the opposed electrode 33 as the common cathode and the wiring layer 24 is not limited to be provided continuously in the Y direction or the X direction. For example, the contact portion may be provided in an island-like shape in a plural number in the base material 11 between the wiring layer 24 and the opposed electrode 33.

Modification Example 5

In the above-described first embodiment and the second embodiment, the element substrate 10 and the opposed substrate 41 are adhered via the dam material 42, but are not limited thereto. For example, the element substrate 10 and the opposed substrate 41 may be adhered to each other without providing the dam material 42 by giving an adhesion to the transparent resin layer 35 (transparent resin layer 45). In that case, it is not necessary to give a margin in the width in the X direction and the Y direction of the non-display region E3 in consideration of the positional accuracy when to dispose the dam material 42 to the non-display area E3. It is possible to provide the organic EL device 100 and the organic EL device 200 which is more compact by narrowing the width of the non-display region E3. The transparent resin layer 35 (transparent resin layer 45) may be formed to overlap at least the display region E0, but does not necessarily cover the end portion 33e of the opposed electrode 33 or the end portion 34e of the sealing layer 34.

Modification Example 6

In the organic EL device 100 of the above-described first embodiment and the organic EL device 200 of the above-described second embodiment, the light emitting pixels provided in the actual display region E1 are not limited to the sub-pixels 18B, 18G, and 18R corresponding to the light emission of blue (B), green (G), and red (R). For example, the light pixel may have a sub-pixel 18Y emitting yellow (Y) in addition to the three colors. As a result, it is possible to further increase the color reproducibility.

Modification Example 7

The light emitting device applicable to the sealing structure of the above-described first embodiment is not limited to the top-emission type organic EL devices 100 and 200. For example, it is possible to provide a semi-transmissive reflective layer between the pixel electrode 31 and the base material 11 using the opposed electrode 33 as the reflective layer and to apply the light emission from the light emitting functional layer 32 to the bottom-emission type organic EL device extracted from the base material 11.

The present application claims priority to Japanese Patent Application No. 2012-174686 filed in the Japanese Patent Office on Aug. 7, 2012, the entire contents of which are incorporated herein by reference.

What is claimed is:
1. A light emitting device comprising:
a substrate;
a plurality of light emitting elements having functional layers in which an organic light emitting layer is included between an anode and a cathode; and
a sealing layer that seals the plurality of light emitting elements,
wherein the sealing layer is formed so as to cover the cathode in the same region where the cathode is formed or inwards from the region,
wherein the cathode is formed over the plurality of light emitting elements as a common cathode and has a part that is not covered by the sealing layer, and
the cathode having an end portion that extends away from the light emitting elements at least as far as does an end portion of the sealing layer in a direction parallel to an upper surface of the substrate.
2. The light emitting device according to claim 1, wherein a portion, which is not covered by the sealing layer, of the common cathode is passivated.
3. An electronic apparatus comprising:
the light emitting device according to claim 2.
4. The light emitting device according to claim 1, further comprising:
a wiring layer formed between the substrate and the common cathode; and
a contact portion that is formed between the wiring layer and the common cathode, is in contact with the common cathode of the portion covered by the sealing layer, and electrically connects with the wiring layer and the common cathode.

5. An electronic apparatus comprising:
the light emitting device according to claim 4.

6. The light emitting device according to claim 1,
wherein the sealing layer includes a first inorganic sealing layer formed in contact with the common cathode, a buffer layer sequentially laminated on the first inorganic sealing layer, and a second inorganic sealing layer.

7. The light emitting device according to claim 6,
wherein the buffer layer is configured of an organic material.

8. An electronic apparatus comprising:
the light emitting device according to claim 7.

9. An electronic apparatus comprising:
the light emitting device according to claim 6.

10. The light emitting device according to claim 1, further comprising:
a color filter formed to correspond to the plurality of light emitting elements on the sealing layer.

11. An electronic apparatus comprising:
the light emitting device according to claim 10.

12. The light emitting device according to claim 1, further comprising:
an opposed substrate disposed opposite with respect to the sealing layer of the substrate via a transparent resin layer.

13. The light emitting device according to claim 12,
wherein the transparent resin layer has a dam material preventing the transparent resin layer from protruding outwards from the opposed substrate, and wherein the dam material is provided in a position overlapping the outer edge of the sealing layer.

14. An electronic apparatus comprising:
the light emitting device according to claim 1.

15. A method of manufacturing a light emitting device provided with a plurality of light emitting elements including a functional layer in which an organic light emitting layer is included between an anode and a cathode on a substrate, the method comprising:
forming the cathode over the plurality of light emitting elements as a common cathode;
forming a sealing layer that covers the common cathode and seals the plurality of light emitting elements in the same region where the common cathode is formed or inwards from the region so that the cathode has a part that is not covered by the sealing layer; and
forming the cathode having an end portion that extends away from the light emitting elements at least as far as does an end portion of the sealing layer in a direction parallel to an upper surface of the substrate.

16. The method of manufacturing a light emitting device according to claim 15, further comprising,
patterning the common cathode using the sealing layer as a mask.

17. The method of manufacturing a light emitting device according to claim 16,
wherein the common electrode is dry-etched using treatment gas containing oxygen in the patterning of the common cathode.

18. The method of manufacturing the light emitting device according to claim 15,
wherein the forming of the sealing layer includes forming a first inorganic sealing layer in contact with the common cathode, forming a buffer layer in contact with the first inorganic sealing layer, and forming a second inorganic sealing layer covering the buffer layer.

19. The method of manufacturing a light emitting device according to claim 18, further comprising:
performing a plasma treatment using the treatment gas containing oxygen on the substrate in which the first inorganic sealing layer is formed before the buffer layer is formed.

20. The method of manufacturing a light emitting device according to claim 15,
wherein the forming of the sealing layer has cutting a mother substrate while cutting a margin of the interval by forming the sealing layer at intervals with respect to scribe lines for extracting the substrate from the mother substrate using the mother substrate, on which the substrate is imposed in a plural number.

\* \* \* \* \*